United States Patent [19]
Corrons et al.

[11] 3,969,689
[45] July 13, 1976

[54] DUAL DIODE OSCILLATOR AND AIRSTRIP TRANSMISSION LINE APPARATUS

[75] Inventors: Bill E. Corrons, Montclair; James F. Barker, Twenty Nine Palms, both of Calif.

[73] Assignee: General Dynamics Corporation, Pomona, Calif.

[22] Filed: Apr. 7, 1975

[21] Appl. No.: 565,488

[52] U.S. Cl. ............................ 331/107 R; 331/56; 331/101; 333/84 M
[51] Int. Cl.² ........................................ H03B 7/14
[58] Field of Search ............... 331/96, 56, 99, 101, 331/107 T, 107 R, 107 G; 333/84 M

[56] References Cited
UNITED STATES PATENTS

| | | | |
|---|---|---|---|
| 3,491,310 | 1/1970 | Hines | 331/107 |
| 3,593,186 | 7/1971 | Dench | 331/56 |
| 3,665,339 | 5/1972 | Liu | 331/99 |
| 3,714,605 | 1/1973 | Grace et al. | 331/56 |

*Primary Examiner*—John Kominski

[57] ABSTRACT

Novel apparatus is provided which permits the combination of the peak pulse power from a pair of avalanche diode oscillators, each diode driving a respective one of two symmetrically suspended airstrip transmission lines which are coupled to a common output connector.

10 Claims, 3 Drawing Figures

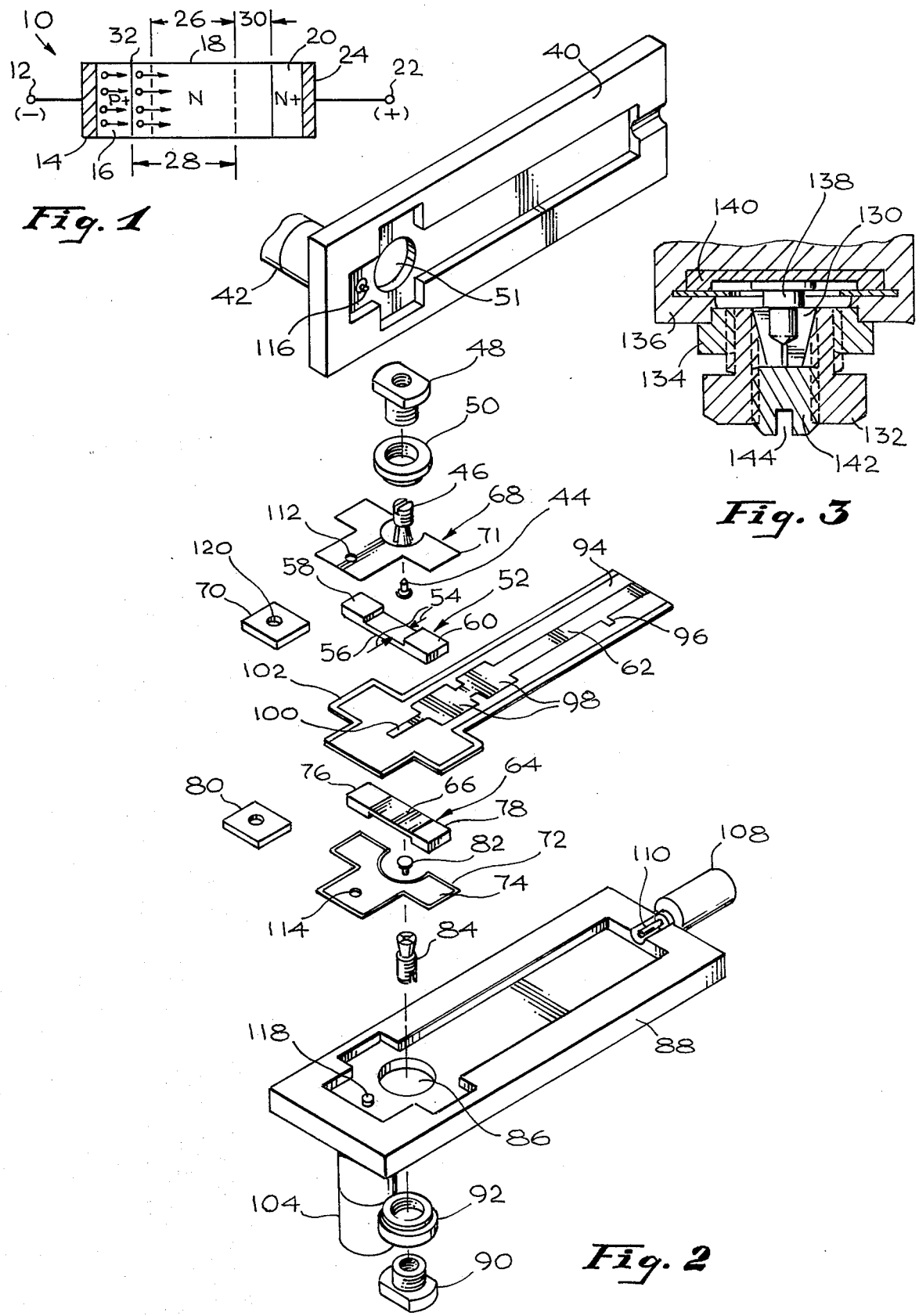

DUAL DIODE OSCILLATOR AND AIRSTRIP TRANSMISSION LINE APPARATUS

BACKGROUND OF THE INVENTION

1. Field of the Invention

This invention relates to apparatus for the generation of radio-frequency power at microwave frequencies and more specifically to apparatus for combining the power generated by individual semiconductor devices without producing undesirable modes of oscillation or destructive interaction between the semiconductor devices that are generating the power.

2. Description of the Prior Art

In the past, the generation of power by semiconductor devices operating in the negative resistance region has been severely limited in the amount of power that has been obtainable. As a result, various efforts have been undertaken to permit the combination of the power generated by the individual semiconductor oscillators. However, the combining networks of the past have been complex and, further, often produced oscillations at various undesired frequencies and with varying degrees of instability. This was particularly true in devices operating at the microwave frequencies because the physical sizes of the units involved easily became important multiples of a quarter wavelength at the operating frequencies, thus producing, or tending to produce, multiple resonances of the circuits including the semiconductor devices.

Further, oscillators including multiple diodes, particularly when they are pulsed to levels of 10 to 20 watts with 20 to 30% duty cycles, may generate sufficient heat so as to make destruction of the diode junctions a distinct possibility. At the same time returning to such devices as klystrons, traveling wave tubes, backward-wave oscillators and magnetrons is not an acceptable course of action in many applications where compactness and minimal weight are paramount. Thus, solving the problems of spurious resonances, limited power and destructive heat-rise in the semiconductor devices utilized in such microwave oscillators is the only acceptable course of action.

Accordingly, it is a general object of this invention to provide a semiconductor microwave oscillator which is free of the problems set forth hereinbefore.

It is a further object of this invention to provide a microwave oscillator which permits paralleling the semiconductor devices utilized in the oscillator without experiencing undesirable spurious frequency generation or semiconductor device deterioration.

It is a still further object of this invention to provide a microwave oscillator which utilizes multiple avalanche diodes operating in the IMPATT mode and coupled in parallel for increased output without suffering from spurious oscillations.

SUMMARY OF THE INVENTION

In brief, apparatus according to the present invention contemplates a structure in which a dielectric substrate is supported symmetrically between and surrounded by two ground plane plates. The dielectric substrate carries a pair of transmission line center conductors, one on each side of the substrate. Each transmission line is of a resonant length at the desired frequency and is driven by the combination of an avalanche diode and a half-wavelength-long strap cavity. The transmission line center conductors terminate in a common output connector wherein the power from each driven transmission line is combined with that from the other driven transmission line. Each of the avalanche diodes is held in firm electrical contact with the center of a respective one of the cavity straps by a metallic collet which grips the end of the diode remote from the strap. Each collet is adjustable in position along its axis by reason of an internally and externally threaded collet holder in one of the ground plane plates. The collet holder having a centrally located opening through its length (that opening being threaded) permits adjustment of the collet so that it grips its associated diode firmly, thus making good electrical and thermal contact therewith. Similarly, each of the collet holders is in good electrical and thermal contact with one of the ground plane plates of the structure as a result of which good electrical grounding and thermal heat sinking is realized. The ability to adjust the position of the collet axially permits mounting the diode it carries so that its terminal not gripped by the collet may be pulled down upon, or pushed against an electrical element with which it is to make contact. The use of collets instead of the conventional springs for holding the avalanche diodes in position adds to the overall ruggedness of the oscillator according to this invention. Further, the use of collets makes interchangeability of diodes a simple process. The securing of the substrate between the two ground plane plates in combination with the support from the ground plane plates of the diodes by means of the collets assures an overall oscillator package which is electrically, mechanically and thermally sound.

BRIEF DESCRIPTION OF THE DRAWINGS

A better understanding of the invention may be had from a consideration of the following detailed description, taken in conjunction with the accompanying drawings, in which:

FIG. 1 is a simplified diagram of an IMPATT diode, such as is employed in arrangements in accordance with the present invention;

FIG. 2 is an exploded view of a dual-diode airstrip oscillator according to this invention; and FIG. 3 is a cross-sectional view showing one example of those portions of the structure of FIG. 2 which hold the IMPATT diodes in contact with their respective transmission lines.

DESCRIPTION OF THE PREFERRED EMBODIMENT

In FIG. 1, an IMPATT (IMPact Avalanche Transit Time) diode 10 includes a terminal 12 which is connected through a contact 14 to a region 16, the region 16 being of low resistivity P-type silicon. A region 18 is of N-type silicon and region 20 is of low resistivity N-type silicon. The region 20 is connected to a terminal 22 by a contact 24 which forms a non-rectifying junction with the region 20. A portion 26 of the region 18 is the drift zone. A portion 28 of the region 18 is the depletion zone and a portion 30 of the region 18 is an undepleted zone. In the narrow avalanche region around a junction 32, carrier multiplication by impact ionization occurs. In the portion 26, the drift region, where no impact ionization occurs, the carriers drift at field-independent velocities.

The negative resistance of the diode 10 is attributable to a phase shift between the current through the diode and voltage across it. Two sources of phase delay exist. The first cause of phase delay is the avalanche multiplication process which has been mentioned. The other phase delay is caused by the transit time of the holes drifting through the drift portion 26 of the region 18. The avalanche process causes a phase delay because the rate of generation of electron-hole pairs in the avalanche region is proportional to both the electric field and the density of the electrons and holes that are present. If a small RF voltage at a frequency in the video range and a dc bias voltage near breakdown are impressed across the diode 10, the rate of generation of electron-hole pairs will exceed the rate at which the pairs leave the avalanche region. Both the density of the carriers and current will grow exponentially with time as long as the RF and dc voltages, in combination, give a total field beyond the breakdown potential of the junction. When the RF voltage changes sign and subtracts from the dc bias voltage, the rate of generation of electron-hole pairs decreases, causing the current to decrease. The current generated by the avalanche process is at its maximum when the RF field passes through zero.

In summary, the avalanche process is an inductive phenomenon. Current produced by the avalanche process lags its related voltage by 90°. The portion 26, which is the drift region of the diode 10, introduces an additional 90° phase lag. At any given frequency, the total phase lag in the diode 10 is 180° and the device appears to be nearly a pure negative resistance.

A structure utilizing a pair of avalanche diodes exhibiting such characteristics is set forth in FIG. 2 which is an exploded view of a preferred embodiment of the invention. In FIG. 2, a first ground plane plate 40 is of material, such as aluminum, that has good conductivity, both of heat and of high frequency currents. The ground plane plate 40 is rotated 90° in the drawing in order to show its interior configuration. A connector 42 is provided for the introduction of both biasing signals and modulating signals to a first avalanche diode 44 which generates microwave signals as described hereinafter. The diode 44 is held in position by a combination of a collet 46 and cooperating members 48 and 50 which support the collet 46 in an opening 51 through the first ground plane 40 and permit the pressing of the diode 44 against the electrically conductive surface of a cavity strap 52. The cavity strap 52 has a predetermined width as indicated by the arrows 54. This width is optimized to minimize losses in a resonator formed by the cavity and to maximize efficiency of power conversion from dc to RF. The cavity strap 52 may be made of copper, brass or any other good electrical and heat conductive material and is a continuous conductor along its surface except for a region having an extent corresponding to the extent of a portion 56 but on the opposite side of the strap 52 from that which is shown. A non-conductive, low-loss dielectric material is applied to form a non-conductive surface over that region. The extent of that insulating layer can be seen more clearly in connection with the corresponding cavity strap 64 which is conductive along its surface except for a region 66 which carries the dielectric material as described in connection with the cavity strap 52.

A plate 68 acts as a combination dc path for operating voltages applied to the diode 44 and as a by-pass condenser for RF currents from the portions 58 and 60 of the cavity strap 52. A load 70 is made of ferrite material and is an RF absorbing element which absorbs energy leaking from the strap cavity made up of the cavity strap 52 and the other elements associated with it. By absorbing energy from the cavity it also acts as a load on the cavity and helps to eliminate spurious oscillations of the elements, including the diode 44, which make up one half of the dual-diode airstrip oscillator disclosed herein.

The plate 68 has a low-loss substrate 71 which constitutes the exposed side of plate 68 in FIG. 2. The opposite side of that plate carries a thick layer of conductive material such as copper which may be tinned to simplify the matter of securing other conductive elements to it. A plate 72 in the second portion of the dual-diode airstrip oscillator shows a conductive surface 74 exposed for contact therewith by the second cavity strap 64 through a pair of end portions 76 and 78, respectively. When the dual-diode airstrip oscillator is assembled, a load 80, which corresponds to the load 70, is positioned adjacent the strap cavity formed by the cavity strap 64 joined to the surface 74 of the plate 72. In use, load 80 absorbs energy leaking from that strap cavity. A second avalanche diode 82 is supported in a collet 84 which, in turn, is supported in an aperture 86 of a lower ground plane plate 88 by a hollow, threaded screw 90 and a cooperating, internallly threaded ring 92. A substrate 94 may be of a fiberglass composition or, for some particular applications, may be made of silica. In any event it should be of a material which exhibits low dielectric losses at the extremely high frequencies which are generated within the oscillator according to this invention. The substrate 94 carries thereon, in symmetrical fashion on both the upper and lower sides thereof, identical transmission lines. The transmission line on the upper side of the substrate 94 in FIG. 2 is the transmission line 62 which has a matching stub 96 and a pair of line transformers 98 as well as an input coupling element 100. This transmission line and its counterpart, not shown, are made of copper, silver, gold or any other material of high conductivity. From the fabrication standpoint it is most convenient to work with copper since the printed circuit techniques for etching copper are well established.

An edge portion 102 is also conductive in nature and may be of copper. It is formed by photoetching, or similar techniques well known in the printed circuit field, as a raised ridge for contacting the adjacent ground plane plate 40 upon assembly. As has been indicated, the opposite side of substrate 96 carries a mirror image of the transmission line and edge portions which are visible on the upper side of the substrate 94 in FIG. 2. An input connector 104 is provided to permit the introduction of biasing and modulating voltages to the avalanche diode 82 in the same fashion as the input connector 42 permits the introduction of biasing and modulating voltages to the diode 44. An output connector 108 has its internal conductor 110 slotted, as shown, to engage the upper and lower transmission lines on the substrate 94 so as to parallel the output signals appearing at the ends of the transmission lines proximate to output connector 108.

When the dual diode airstrip oscillator of FIG. 2 is assembled, the plates 68 and 72 have their anchor holes 112 and 114 engaging stubs 116 and 118 of the respective ground planes 40 and 88, with the result that the dielectric sides of the plates 68 and 72 are in position in the correspondingly shaped portions of the upper and lower ground plane plates 40 and 88, contiguous with their respective ground planes. The stubs 116 and 118 have their inner extremities soldered to the conductive sides of the plates 68 and 72, respectively. In turn, the cavity straps 52 and 64 have their respective extremities soldered to the conductive surfaces of the plates 68 and 72, respectively. One end of each of the avalanche diodes 44 and 82 is held by a collet, such as the collet 46 and the collet 84, and those collets are held at ground potential by being directly supported in the ground plane plates 40 and 88, respectively. The remaining ends of the diodes 44 and 82 are held in firm contact with their respective cavity straps 52 and 64 by reason of the adjustability residing in the threading of the hollow cap screws 48 and 90 and the internal threading of the mounting rings 50 and 92. Further details of the collets 46 and 84 are set forth in FIG. 3. The ferrite loads 70 and 80 each have a depression (such as depression 120) therein, and those depressions fit over the protrusions of the respective stubs 116 and 118 through the anchor holes 112 and 114 of their respective plates 68 and 72. In that position they are adjacent the cavities formed by the straps 52 and 64 so as to act as energy absorbers or loads on those cavities. Transmission line 62 and its counterpart, not shown, are coupled to their respective strap cavities by series capacitors formed by the dielectric strips, such as the strip 66 on the strap 64, which block direct current to the transmission line from the strap but permit RF current flow through the capacitors which are formed.

The length of the portion 56 in the strap 52 (transverse to the arrows 54) is approximately one-half wavelength at the desired frequency of oscillation. The physical length of the portion 56 may differ slightly from an electrical one-half-wavelength at the fundamental frequency because of the inherent inductance of the line and the capacitive characteristics of the diodes 44 and 82 and the series coupling condensers formed by the insulated portions, such as the portion 66 on cavity strap 64, as it contacts the transmission line coupling stub 100. Because diodes 44 and 82 make contact with cavity straps 52 and 64, respectively, at the centers of those straps, the diodes are being resonated by substantially quarter-wavelength lines which have voltage nodes at their remote ends, those remote ends being grounded for RF signal purposes by the by-pass condenser action of the portions 58 and 60, for example, acting through the plate 68 which, as has been indicated, has a low-loss dielectric substrate 71 in contact with the upper ground plane plate 40. Essentially, therefore, the oscillations of diodes 44 and 82 are produced by, in each case, two quarter-wavelength lines shorted at their remote ends.

The transformer sections 98 and their counterparts on the obverse side of the substrate 94 match the impedances of the respective transmission lines to their associated strap cavities, each with its avalanche diode. The stub 96 and its counterpart further match the transmission lines to the impedance of the output connector 108. The balanced transmission line construction of FIG. 2 supports oscillation in the TEM mode.

When reducing this invention to practice, diodes 44 and 82 were IMPATT diodes from Hewlett Packard Company of Palo Alto, Calif. When approximately 110 volts in either dc or pulse form is applied to these diodes they are at the breakdown or avalanche point. However to derive power output at the millimeter wavelengths contemplated herein it is necessary to pulse them further in an amount of from 20 to 30 volts with a signal at a repetition rate in the video range of frequencies. These dc bias and pulse voltages are applied through the connectors 42 and 104. If pulse biasing is used, the width of the biasing pulse is approximately one-half microsecond with an amplitude of 110 volts and the additional pulse to produce RF signal output from the avalanche action may be one-fourth microsecond in width. The duty cycle at which these diodes have been operated runs from 20 to 30%. In actual operation utilizing two diodes in the airstrip configuration of FIG. 2 a combined power output of 8 watts was realized in the 10 GHz region.

To suppress spurious oscillations a series inductance shunted by a resistance may be included in the biasing-modulating line to the diodes. The size of the inductance is from 2 to 5 microhenries and the size of the resistor is 20 ohms with the Hewlett Packard diodes. Of course, these parameters change with the characteristics of the diodes.

In FIG. 3 a collect 130 is adjustably supported in a holder 132 which, itself, is adjustably supported in a ring 134. The ring 134 is secured in a housing 136. A diode 138 is held securely in the collet 130 so as to assure accurate positioning of the diode 138 with respect to a strap cavity 140 which it feeds.

The collet 130 has threads on the outer surface of a portion 142 thereof cooperating with threads in the holder 132 so that by turning the collet 130, utilizing a slot 144 (which is designed to cooperate with a screwdriver placed in that slot), the pressure of the collet 130 on the diode 138 may be adjusted. This assures both good electrical and heat conductivity from the diode 138 to the housing 136. After the diode 138 is secured in the collet 130 the position of the diode 138 may be adjusted along its axis by turning the collet holder 132 and causing the threads on the exterior surface thereof to cooperate with the threads on the interior surface of the ring 134 in the housing 136. The relative positions of the elements which have been described and how each of these elements functions may be understood by studying FIG. 3 in combination with, particularly, elements 44, 46, 48 and 50 of the exploded view of FIG. 2. As has been indicated, the mechanical structure of FIG. 3 provides good heat conduction and electrical conduction from diode 138 to the housing 136 as well as developing a stable mechanical connection which is adjustable relative to the housing 136. An adequate heat sink such as this is necessary to cool the diode because of the low dc to RF efficiency of such an avalanche diode when it is operating in the IMPATT mode. The structure of FIG. 3 meets those requirements and in addition provides ease of interchangeability of diodes.

Although there has been described hereinbefore a specific embodiment of a multi-diode solid state microwave oscillator in accordance with this invention for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of this invention.

What is claimed is:
1. A multiple-diode microwave oscillator including, in combination:
   a plurality of ground plane plates;
   a plurality of airstrip transmission lines positioned between said ground plane plates;

a plurality of avalanche diodes each positioned in a strap cavity having unbiased conductive walls and coupled to a wall of the cavity and to a respective one of said plurality of transmission lines;

means for coupling operating signals to each of said plurality of avalanche diodes; and means for combining the power from each of said diodes at the same desired frequency and phase.

2. Apparatus according to claim 1 in which said avalanche diodes operate in the IMPATT mode in response to said operating signals.

3. Apparatus according to claim 1 in which the number of transmission lines in said plurality is two and each of said transmission lines is carried on the opposite side of a common non-conductive substrate, and in which the number of ground plane plates is two.

4. Apparatus according to claim 1 in which each strap cavity includes a conductive strap having a total effective length of one-half of the wavelength at the desired frequency of oscillation and each of said avalanche diodes is coupled to the center of its associated strap.

5. Apparatus according to claim 4 in which both ends of the conductive strap are grounded through said ground plane plates for RF signal purposes.

6. Apparatus according to claim 1 in which each of said transmission lines is capacitively coupled to its associated avalanche diode.

7. Apparatus according to claim 1 in which each of said avalanche diodes is carried in an adjustably positionable collet.

8. Apparatus according to claim 7 in which said collet is metallic.

9. Apparatus according to claim 3 in which said non-conductive substrate is carried centrally between a pair of ground plane plates.

10. Apparatus according to claim 1 further including a ferrite load individually coupled to each of said strap cavities.

* * * * *